United States Patent
Park

(10) Patent No.: US 7,109,543 B2
(45) Date of Patent: Sep. 19, 2006

(54) SEMICONDUCTOR DEVICE HAVING TRENCH CAPACITOR AND METHOD FOR FABRICATING THE SAME

(75) Inventor: Cheol Soo Park, Kyoungki-do (KR)

(73) Assignee: Dongbuanam Semiconductor Inc., Seoul (KR)

(*) Notice: Subject to any disclaimer, the term of this patent is extended or adjusted under 35 U.S.C. 154(b) by 46 days.

(21) Appl. No.: 10/329,096

(22) Filed: Dec. 23, 2002

(65) Prior Publication Data

US 2003/0116798 A1 Jun. 26, 2003

(30) Foreign Application Priority Data

Dec. 24, 2001 (KR) ........................ 10-2001-0084011

(51) Int. Cl.
- H01L 27/108 (2006.01)
- H01L 29/76 (2006.01)
- H01L 29/94 (2006.01)
- H01L 31/119 (2006.01)

(52) U.S. Cl. ........................ 257/301; 257/303; 257/306; 257/E21.651

(58) Field of Classification Search ............... 257/301, 257/302, 303, 304, 305, 306, E21.651; 438/243, 438/244, 245, 246, 247, 248, 249, 386, 387, 438/388, 389, 390, 391
See application file for complete search history.

(56) References Cited

U.S. PATENT DOCUMENTS

| | | | |
|---|---|---|---|
| 4,649,625 A * | 3/1987 | Lu | 438/245 |
| 5,097,381 A * | 3/1992 | Vo | 361/313 |
| 5,372,966 A * | 12/1994 | Kohyama | 438/243 |
| 5,555,520 A * | 9/1996 | Sudo et al. | 365/149 |
| 5,670,388 A | 9/1997 | Machesney et al. | |
| 5,930,107 A * | 7/1999 | Rajeevakumar | 361/321.4 |
| 5,998,821 A * | 12/1999 | Hieda et al. | 257/301 |
| 6,140,175 A * | 10/2000 | Kleinhenz et al. | 438/243 |
| 6,150,210 A * | 11/2000 | Arnold | 438/243 |
| 6,204,112 B1 * | 3/2001 | Chakravarti et al. | 438/243 |
| 6,204,527 B1 * | 3/2001 | Sudo et al. | 257/301 |
| 6,207,494 B1 * | 3/2001 | Graimann et al. | 438/248 |
| 6,236,079 B1 * | 5/2001 | Nitayama et al. | 257/306 |
| 6,265,741 B1 * | 7/2001 | Schrems | 257/301 |
| 6,339,228 B1 * | 1/2002 | Iyer et al. | 257/301 |
| 6,395,597 B1 | 5/2002 | Noble | |
| 6,541,810 B1 * | 4/2003 | Divakaruni et al. | 257/302 |
| 6,835,981 B1 * | 12/2004 | Yamada et al. | 257/347 |
| 2001/0050388 A1 * | 12/2001 | Hamamoto | 257/301 |

* cited by examiner

*Primary Examiner*—Shouxiang Hu
(74) *Attorney, Agent, or Firm*—Timothy J. Keefer; Seyfarth Shaw LLP

(57) ABSTRACT

A semiconductor device and a method for fabricating the same. The device comprises a silicon substrate having a conductive well; a trench formed in the conductive well; a plate electrode formed on the sidewall of the trench; a capacitor insulating film and a storage node electrode; a first storage node connector formed on the storage node electrode; an insulating film formed on the first storage node connector; a silicon layer formed on the entire structure; word lines formed on the silicon layer; source and drain regions formed in the silicon layer; a contact hole, formed in the silicon layer and the insulating film, such that the first storage node connector and the source region are exposed; and a second storage node connector, formed in the contact hole, such that the source region and the first storage node connector are connected to each other.

4 Claims, 5 Drawing Sheets

SEMICONDUCTOR DEVICE HAVING TRENCH CAPACITOR AND METHOD FOR FABRICATING THE SAME

BACKGROUND OF THE INVENTION

1. Field of the Invention

The present invention relates in general to a semiconductor device and a fabricating method thereof. More particularly, the present invention relates to a semiconductor device having a capacitor in a trench, and to a method for fabricating the same.

2. Description of the Prior Art

With the development of semiconductor fabrication technology, demands for memory devices were rapidly increased. A capacitor, which is used as a means for storing data, has capacitance, which varies depending on the area of electrodes, the distance between electrodes, and the dielectric constant of a dielectric film interposed between electrodes.

However, as a semiconductor device is highly integrated, there is a problem in that the area occupied by a capacitor-forming region in the semiconductor device is decreased, so that the electrode area of a capacitor becomes smaller, thereby decreasing the total capacitance of the capacitor.

Another problem is that a separate process is additionally required to solve the problem of the reduction in the capacitance of the capacitor, so that the total fabrication cost of a device is increased.

SUMMARY OF THE INVENTION

Accordingly, the present invention has been made to solve the above-mentioned problems occurring in the prior art, and an object of the present invention is to provide a semiconductor device having a trench capacitor, and a method for fabricating the same, which can make the area of a capacitor small while reducing the fabrication cost of the device.

To achieve the above object, in one aspect, the present invention provides a semiconductor device having a trench capacitor, which comprises: a silicon substrate having a conductive well formed therein; a trench formed in the conductive well; a plate electrode formed on the sidewall of the trench; a capacitor insulating film and a storage node electrode, which were deposited on the plate electrode; a first storage node connector formed on the storage node electrode; an insulating film formed on the first storage node connector; a silicon layer formed on the entire structure; word lines formed on the silicon layer; source and drain regions formed in the silicon layer at portions below both sides of the respective word line; a contact hole, which was formed in the silicon layer and the insulating film below the silicon later, in such a manner that the first storage node connector and the source region are exposed through the contact hole; and a second storage node connector, which was formed in the contact hole, in such a manner that the source region and the first storage node connector are connected to each other via the second storage node connector.

In another aspect, the present invention provides a method for fabricating a semiconductor device having a trench capacitor, which comprises: forming a conductive well in a silicon substrate; forming a trench in the conductive well; forming a plate electrode on the sidewall of the trench; successively depositing a capacitor insulating film and a storage node electrode on the plate electrode; forming a first storage node connector on the storage node electrode; forming an insulating film on the first storage node connector; forming a silicon layer on the entire structure; forming word lines on the silicon layer; forming source and drain regions in the silicon layer at portions below both sides of the respective word lines; forming a contact hole in the silicon layer and the insulating film below the silicon layer, in such a manner that the first storage node connector and the source region are exposed through the contact hole; and forming a second storage node connector in the contact hole, in such a manner that the source region and the first storage node are connected to each other via the second storage node connector.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described in detail with reference to the accompanying drawings.

Figure 1:
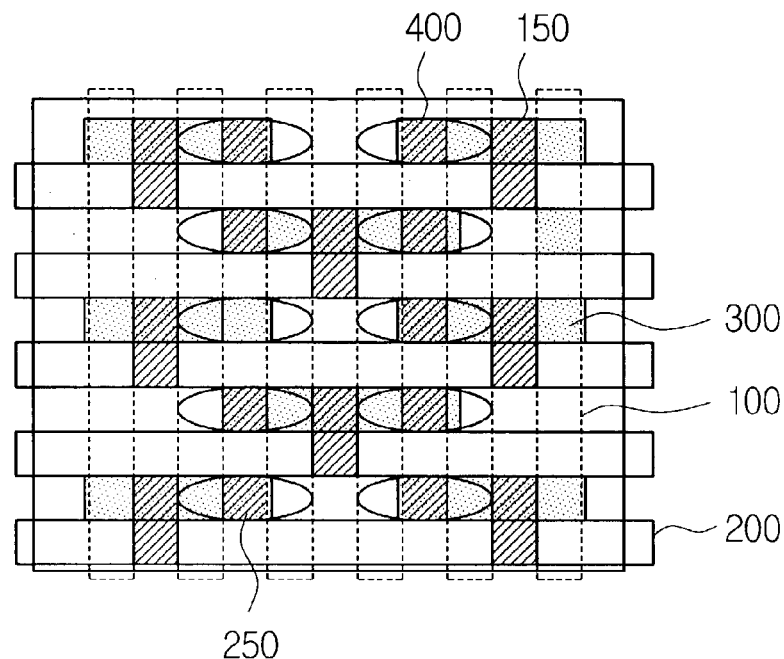
FIG. 1 is a layout drawing, which illustrates a method for fabricating a semiconductor device having a trench capacitor according to the present invention.

FIG. 1 is a layout drawing, which illustrates a method for fabricating a semiconductor device having a trench capacitor according to the present invention.

As shown in FIG. 1, a semiconductor device having a trench capacitor according to the present invention has a plurality of word lines 100 arranged at fixed intervals, and a plurality of bit lines 200 arranged at fixed intervals, which are intersected perpendicularly with the word lines 100.

Moreover, contact plugs 150 are formed between two adjacent word lines 100, while the contact plugs 150 overlap with the bit lines 200 and a film pattern for device isolation 300.

Furthermore, trench contact plugs 250 are formed between the word lines 100 and the bit lines 200 by a trench mask 400.

Hereinafter, an inventive method for fabricating the semiconductor device having the layout as described above will be described in detail with reference to FIGS. 2 to 9.

FIGS. 2 to 9 are cross-sectional views, which illustrate a method for fabricating a semiconductor device having a trench capacitor according to the present invention.

Figure 2:
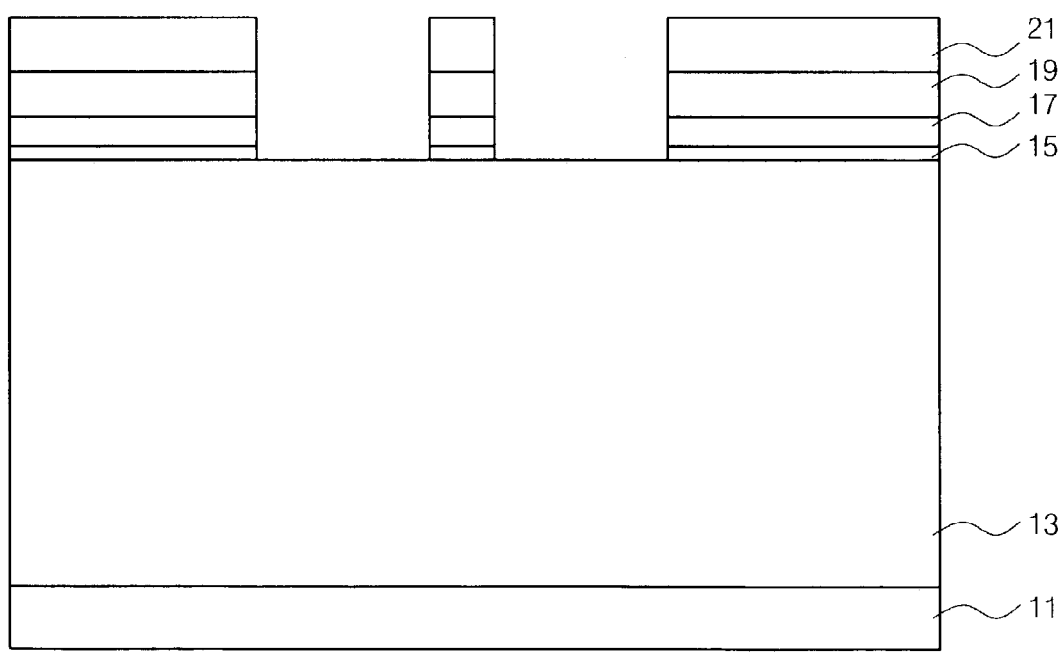
FIGS. 2 to 9 are cross-sectional views, which illustrate a method for fabricating a semiconductor device having a trench capacitor according to the present invention.

As shown in FIG. 2, ions are first implanted into a silicon substrate 11, so that an N-well 13 is formed in the inner region of the substrate 11.

Figure 3:
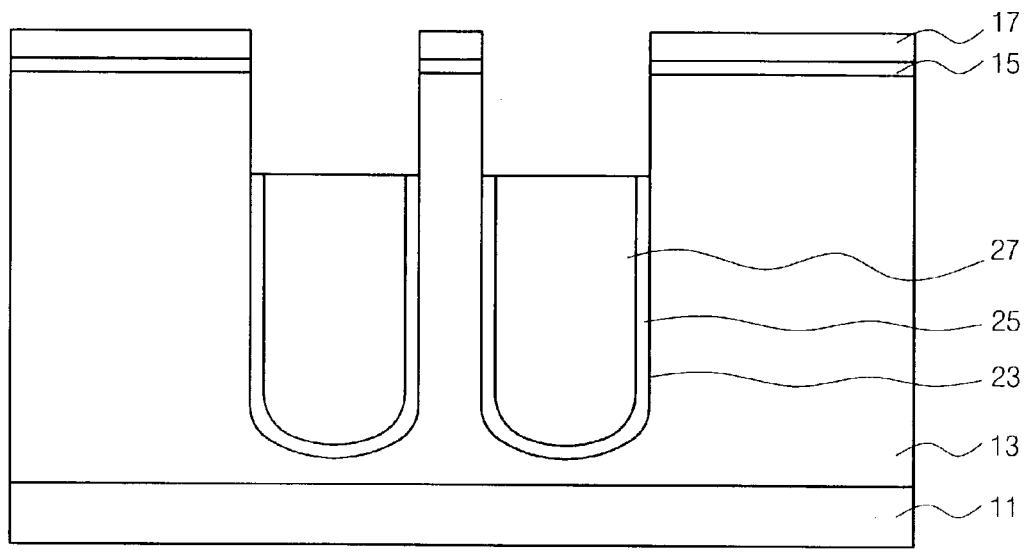

As shown in FIG. 3, a pad oxide film 15, a first nitride film 17 and a first oxide film 19 are then successively deposited on the N-well 13, after which a photoresist pattern 21 serving as a trench mask is formed on the first oxide film 19.

Then, using the photoresist pattern 21 as a mask, the first oxide film 19, the first nitride film 17 and the pad oxide film 15 are successively dry etched.

As shown in FIG. 3, after the photoresist pattern 21 is removed, a blanket etching process is then carried out using the first oxide film 19 as a mask. Thus, the silicon substrate 11 is etched by reactive ion etching (RIE) to a depth of several microns, so that a trench 23 is formed in the silicon substrate 11.

After the inside of the trench 23 is washed, an As-doped LPTEOS oxide film 25 is formed on the trench 23. Then, a photoresist film 27 is applied on the entire structure, in such a manner that the trench 23 is filled with the photoresist film 27. Next, the photoresist film 27 is etched back, so that the surface of the silicon substrate 11 is recessed to a depth of about 2,000 to 3,000 Å. The exposed portion of the As-doped LPTEOS oxide film 25 is then removed by a wet etchant.

Figure 4:
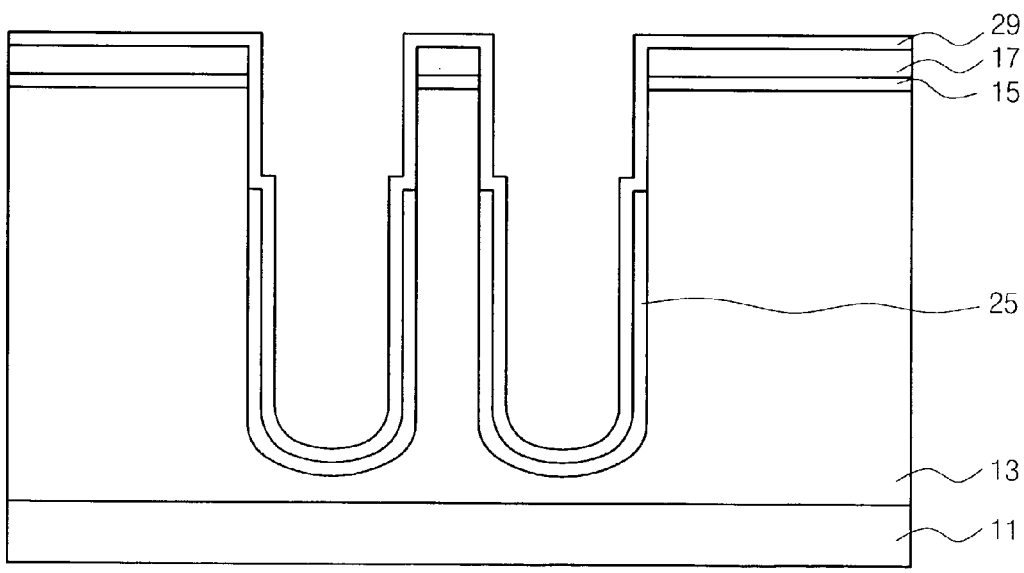
Figure 5:
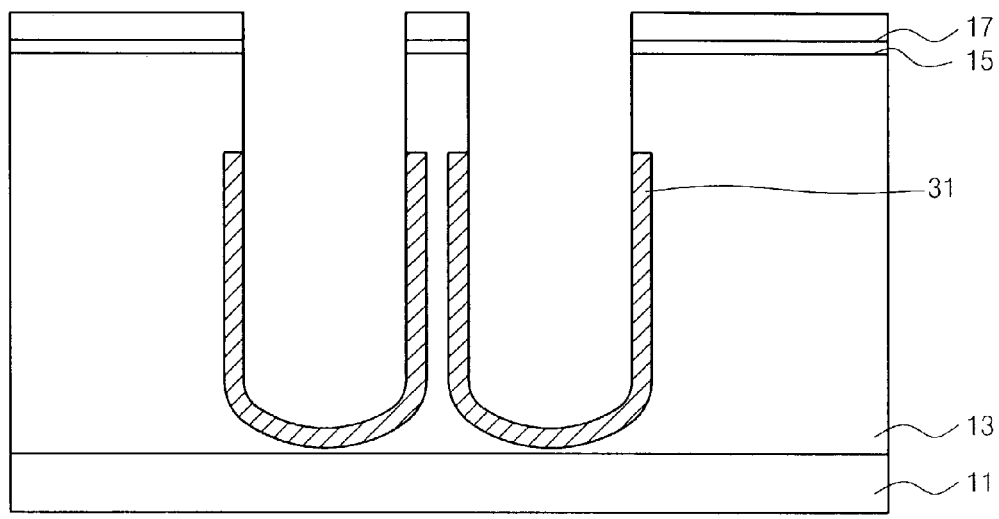

As shown in FIGS. 4 and 5, the photoresist film 27 remaining in the trench 23 is then removed by wet etching, after which a second oxide film 29 made of undoped LPTEOS is deposited on the entire structure, and annealed. Thus, the second oxide film 29 and the As-doped LPTEOS oxide film 25, which are in contact with each other on the inner sidewall of the trench 23, are doped so as to form a plate electrode 31. Then, the remaining second oxide film 29 is removed.

Figure 6:
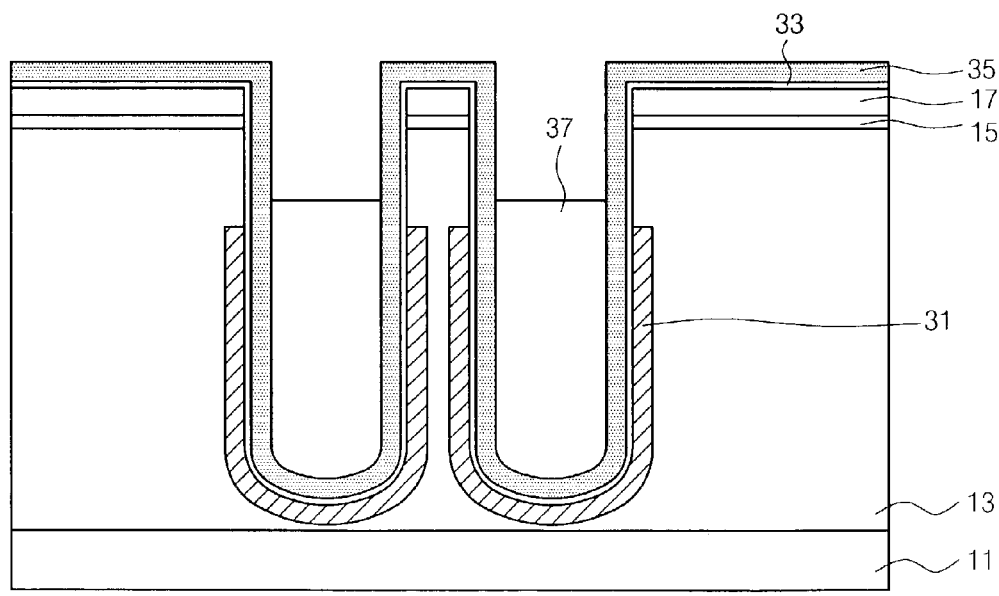

As shown in FIG. 6, a capacitor insulating film 33 is then formed on the entire structure, after which a polysilicon layer 35 serving as a storage node and a third oxide film 37 are successively deposited on the capacitor insulating film 33, so that the inside of the trench 23 is filled with the third oxide film 37.

Thereafter, the third oxide film 37 is blanket etched according to a drying etching process, so that the highly doped plate electrode 31 is etched to a depth of several hundreds of Angstrom (Å) to 0.1 μm.

Figure 7:
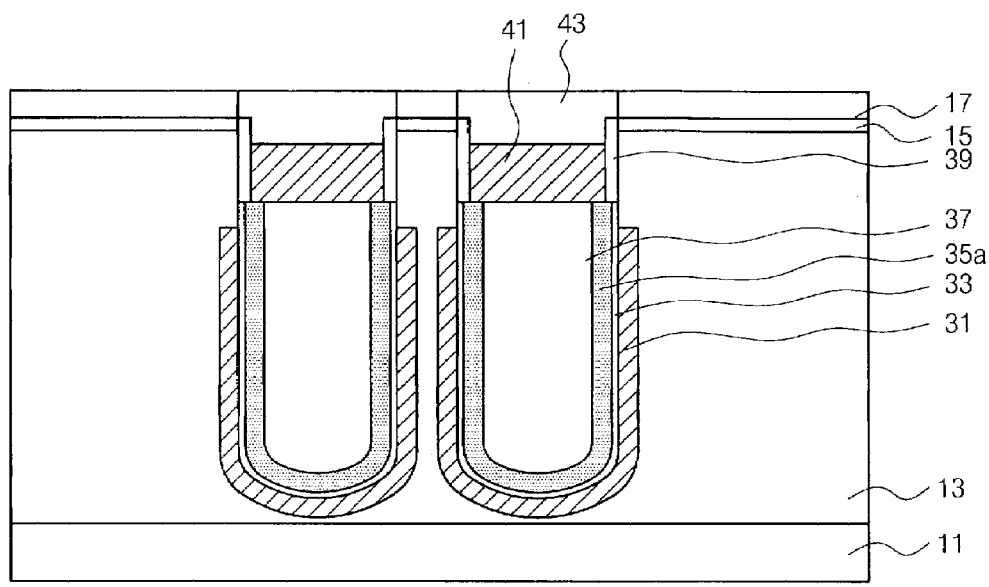

As shown in FIG. 7, the exposed portion of the polysilicon layer 35 serving as a storage node on the third oxide film 37 is then etched by anisotropic dry etching. Next, the exposed portion of the capacitor oxide film 33 is wet etched.

Then, a fourth oxide film 39 is thermally grown on the portion of the substrate from which the capacitor oxide film 33 was removed. A first storage node connector 41 is deposited on the fourth oxide film 39 in the same manner as that of doped polysilicon, and blanket etched by isotropic etching such that only a thickness of 500 to 2,000 Å of the first storage node connector 41 remains.

Thereafter, a fifth oxide film 43 is deposited in a thick layer on the entire structure including the first storage node connector 41, which was subjected to the isotropic etching. The fifth oxide film 43 is then planarized by CMS treatment.

Figure 8:
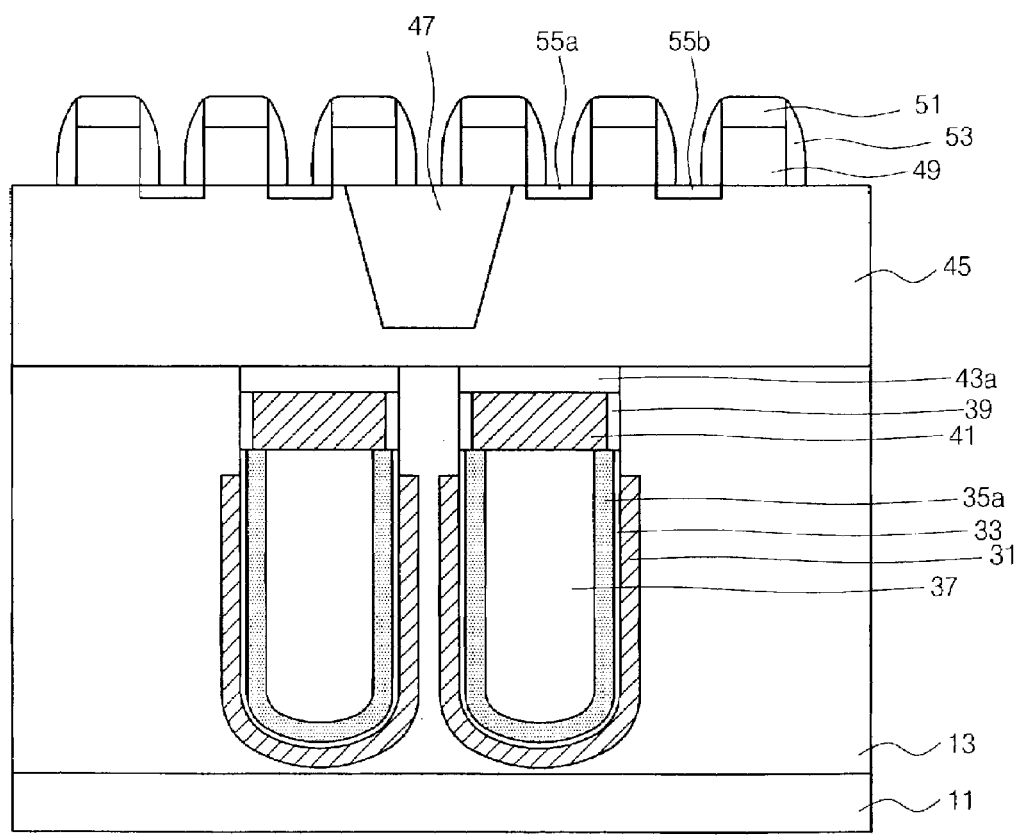

As shown in FIG. 8, the first nitride film 17 is then removed by a hot phosphoric acid etchant, after which the pad oxide 15 is wet etched. Next, a phosphorus-doped epitaxial silicon layer 45 is isotropically grown on the fifth oxide film 43 including the N-well 13, to a thickness of several thousands of Angstrom (Å).

Then, a conventional process for the isolation of a trench device is carried out using a mask for device isolation, so that a film for device isolation, which defines a region for device formation and a region for device isolation, is formed in the phosphorus-doped epitaxial silicon layer 45.

After this, word lines 49 are formed on the region for device formation of the phosphorus-doped epitaxial silicon layer 45, and a second nitride pattern 51 serving as a hard mask is then formed on the upper surface of the word lines 49.

Then, a third nitride film (not shown) is deposited on the entire structure, and selectively patterned so as to form spacers 53 on the sidewalls of the respective word lines 49. At this time, the portion of the phosphorus-doped epitaxial silicon layer 45, which is located at a portion below the side of the spacer 53, is exposed.

Next, source and drain regions 55a and 55b are formed at portions below the exposed surface of the phosphorus-doped epitaxial silicon layer 45.

Figure 9:
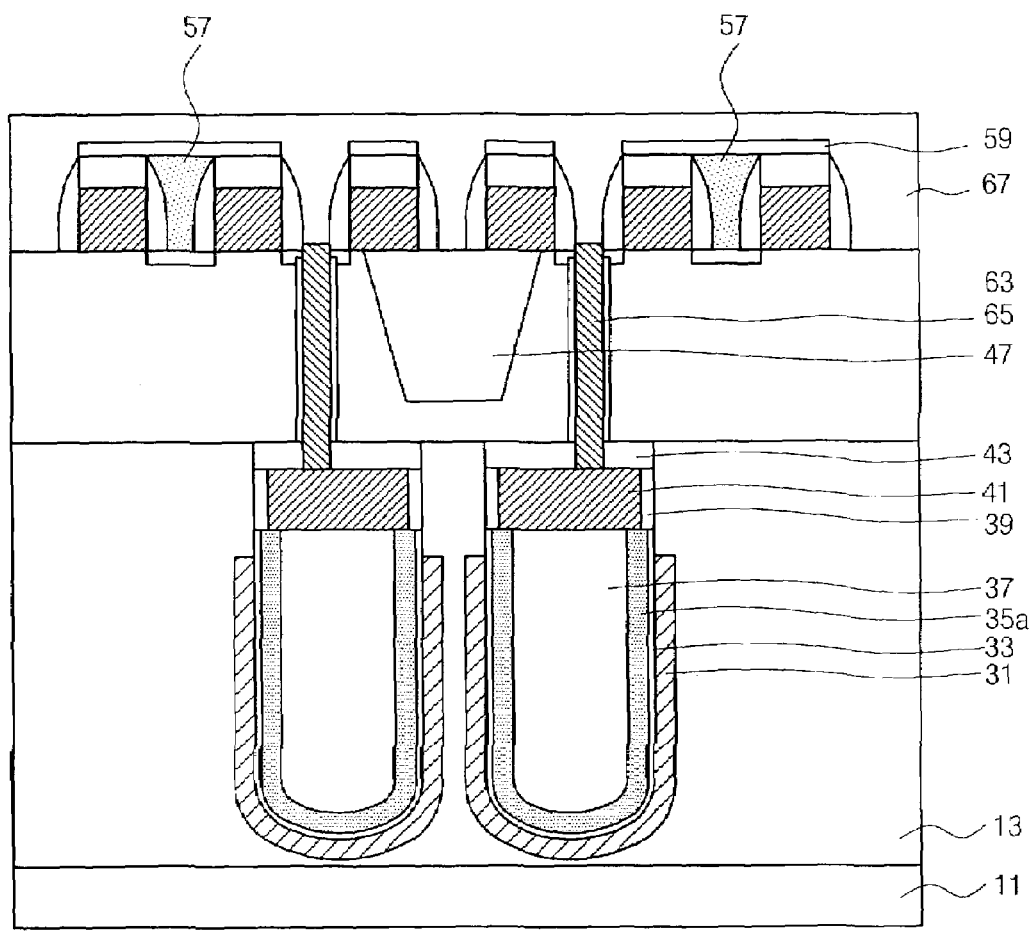

As shown in FIG. 9, a bit line contact plug 57 and a storage node contact plug (not shown) are then formed on the exposed surface of the phosphorus-doped epitaxial silicon layer 45, after which a fourth nitride film 59 is deposited on the bit line contact plug 57 to a thickness of several hundreds of Angstrom (Å).

Although not shown in the drawings, the fourth nitride film 59 is then selectively removed using a trench contact plug mask (not shown), after which the storage node contact plug 57, the source region 55a and the phosphorus-doped epitaxial silicon layer 45 are successively etched, such that the fifth oxide film 43 is exposed.

Thereafter, the exposed portion of the fifth oxide film 43 is wet etched using an etching recipe for etching an oxide film, which was changed from the dry etching recipe. Thus, a connector contact hole (not shown) is formed in such a manner that the upper surface of the first storage node connector is exposed through the connector contact hole.

Although not shown in the drawings, the trench contact plug mask (not shown) is then removed, after which a sixth oxide film 63 is grown on the sidewall of the connector contact hole (not shown), and blanket etched by a dry etching process.

Following this, a phosphorus-doped second storage node connector 65 is deposited in the connector contact hole, and then etched back by blanket etching. Next, an insulating film for planarization is deposited on the resulting structure in a thick layer.

Next, metal interconnection is carried out in a subsequent process according to a conventional method.

As described above, the inventive semiconductor device having the trench capacitor and the inventive method for fabricating the same have the following effects.

In the present invention, the trench capacitor is formed in the inner region of the silicon substrate, and the epitaxial silicon layer is formed thereon, thereby forming a transistor. As a result, the present invention can make the area of the capacitor small while reducing the fabrication cost of the device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A semiconductor device having a trench capacitor, the device comprising:
   a structure which includes a silicon substrate having a conductive well formed with a predetermined depth therein, a trench formed in the conductive well, a plate electrode formed in the sidewall of the trench, a capacitor insulating film deposited on the plate electrode, a storage node electrode having a U-shape on the capacitor insulating film, a first storage node connector formed on the end portions of the storage node electrode, and a first insulating film formed on the first storage node connector;

a silicon layer formed on the surface of the substrate, including a hole exposing a portion of the first storage node connector via the first insulating film;

word lines formed on the silicon layer;

source and drain regions formed in the silicon layer at portions below both sides of the respective word lines; and a second storage node connector formed in the hole, connecting the source region to the first storage node connector.

2. The semiconductor device of claim 1, in which the silicon layer is phosphorous-doped epitaxial silicon layer.

3. The semiconductor device of claim 1, in which a second insulating film is interposed between a portion of the second storage node connector and a portion of the silicon layer.

4. The semiconductor device of claim 1, in which a third insulating film is disposed between a portion of the storage node electrode and a portion of the first storage node connector in the trench.

* * * * *